United States Patent [19]

Beha et al.

[11] Patent Number: 4,786,864
[45] Date of Patent: Nov. 22, 1988

[54] PHOTON ASSISTED TUNNELING TESTING OF PASSIVATED INTEGRATED CIRCUITS

[75] Inventors: Johannes G. Beha, Wadenswil, Switzerland; Russell W. Dreyfus, Mt. Kisco, N.Y.; Allan M. Hartstein, Chappaqua, N.Y.; Gary W. Rubloff, Katonah, N.Y.

[73] Assignee: International Business Machines Corporation, Armonk, N.Y.

[21] Appl. No.: 932,128

[22] Filed: Nov. 18, 1986

Related U.S. Application Data

[62] Division of Ser. No. 717,409, Mar. 29, 1985, Pat. No. 4,644,264.

[51] Int. Cl.[4] .............................................. G01R 31/02
[52] U.S. Cl. .................................................. 324/158 R
[58] Field of Search ............... 29/574; 250/311, 492.2; 136/290; 324/158 D, 158 R, 158 T, 73 R, 73 PC, 71.3; 356/237, 399, 425, 401, 426; 357/6, 30 C

[56] References Cited

U.S. PATENT DOCUMENTS

| | | | |
|---|---|---|---|
| 4,051,437 | 9/1977 | Lile et al. | 324/158 R |
| 4,231,811 | 11/1980 | Somekh et al. | 250/492.2 |
| 4,266,138 | 5/1981 | Nelson, Jr. et al. | 250/492 A |
| 4,296,372 | 10/1981 | Feuerbaum | 324/71 EB |
| 4,301,409 | 11/1981 | Miller et al. | 324/158 D |
| 4,332,833 | 6/1982 | Aspnes et al. | 427/8 |
| 4,333,051 | 6/1982 | Goodman | 324/158 D |
| 4,380,864 | 4/1983 | Das | 29/574 |
| 4,408,883 | 10/1983 | Iwamoto et al. | 356/355 |
| 4,415,851 | 11/1983 | Langner et al. | 324/51 |
| 4,417,203 | 11/1983 | Pfeiffer et al. | 324/51 |
| 4,417,948 | 11/1983 | Mayne-Banton et al. | 156/643 |
| 4,419,530 | 12/1983 | Nath | 136/251 |
| 4,435,610 | 3/1984 | Perlman et al. | 357/6 |
| 4,588,950 | 5/1986 | Henley | 324/158 T |
| 4,609,867 | 9/1986 | Schink | 324/158 D |
| 4,618,541 | 10/1986 | Forouhi et al. | 357/54 |
| 4,644,264 | 2/1987 | Beha et al. | 324/73 R |

FOREIGN PATENT DOCUMENTS 3121666 12/1982 Fed. Rep. of Germany ... 250/492.2
0129508 12/1984 France .

OTHER PUBLICATIONS

Z. A. Weinberg and A. Hartstein, "Photon Assisted Tunneling from Aluminum into Silicon Dioxide", Solid State Communications, vol. 20, pp. 179-182 (1976).
Rubloff, "Contactless Measurement of Voltage Levels Using Photoemission", IBM Technical Disclosure Bulletin, vol. 25, No. 3A, Aug. 1982, pp. 1171-1172.

(List continued on next page.)

Primary Examiner—Reinhard J. Eisenzopf
Assistant Examiner—W. Burns
Attorney, Agent, or Firm—Philip J. Feig

[57] ABSTRACT

Covering metal test pads of a passivated integrated circuit process intermediate wafer or completed integrated circuit chip-to-test, with a thin conductive overlayer, and then accessing the test pads through the passivation layer and conductive overlayer, by a pulsed laser to provide voltage-modulated photon-assisted tunneling through the insulation layer, to the conductive overlayer as an electron current, and detecting the resulting electron current, provides a nondestructive test of integrated circuits. The passivation, normally present to protect the integrated circuit, also lowers the threshold for photoelectron emission. The conductive overlayer acts as a photoelectron collector for the detector. A chip-to-test which is properly designed for photon assisted tunneling testing has test sites accessible to laser photons even though passivated. Such a chip-to-test may be nondestructively tested in air at one or several stages of its processing, without the sacrifices of mechanical probing or of bringing test sites out to output pads. The conductive overlayer may be removed after tests have been completed. Integrated circuit process intermediate chips may be specially designed for testability, with test sites grouped for easy access through windows left uncovered by subsequent layers.

5 Claims, 3 Drawing Sheets

OTHER PUBLICATIONS

Henley, "Logic Failure Analysis of CMOS Using a Laser Probe", Spectrum Sciences, 3050 Oakmead Village Drive, Santa Clara, California 95051.

Rev. Scientific Instruments, vol. 49, No. 6, Jun. 1978, pp. 756–759, American Institute of Physics, New York, M. Kudo et al. "Computer Controlled ESCA for Nondestructive Surface Characterization Utilizing a TV-Type Position Sensitive Detector".

Fujitsu-Scientific & Technical Journal, vol. 19, No. 4, 1983, pp. 431–441, Kawasaki, Japan, A. Ito et al., "Hemispherical Retarding Type Energy Analyzer for LSI Testing by an Electron Beam".

Microelectronics Journal, vol. 11, No. 2, Mar./Apr. 1980, pp. 35–40, Mackintosh Publications Ltd., Luton, GB; C. E. Jowett, "Surface Analytical Techniques Applied to Electronic Components".

"Data Probe Model 2010 IC Logic Laser Analyzer", Mitsui & Co., 1984.

Menzel and Kubalek, "Secondary Electron Detection Systems for Quantitative Voltage Measurements", Scanning, vol. 5, 151–171 (1983).

Bush et al., "Photoconductor Contacting for Module Testing", IBM Technical Disclosure Bulletin, vol. 15, No. 6, Nov. 1972, pp. 2032–2033.

PHOTON ASSISTED TUNNELING TESTING OF PASSIVATED INTEGRATED CIRCUITS

This is a divisional application of application Ser. No. 717,409 filed 03/29/85 now U.S. Pat. No. 4,644,264.

BACKGROUND OF THE INVENTION

1. Field of the Invention

This invention relates to noncontact testing of integrated circuits, and more particularly relates to a photon assisted tunneling roomenvironment testing procedure by which conductive test sites of a passivated integrated circuit wafer, covered with a thin layer of insulation and a transparent conductive layer, are accessed by a pulsed laser to provide voltage-modulated photoemitted photons which tunnel through the insulation layer to the conductive layer for detection.

2. Description of the Prior Art

The following publications are representative of the prior art and scientific background:

Z. A. Weinberg and A. Hartstein, "Photon Assisted Tunneling from Aluminum into Silicon Dioxide," Solid State Communications 20, 179 (1976) describes the theory of photon assisted electron tunneling and its use in an experimental demonstration.

Copending U.S. patent application of Beha, Dreyfus and Rubloff, Ser. No. 667,506 filed Nov. 1, 1984, entitled NON-CONTACT DYNAMIC TESTER FOR INTEGRATED CIRCUITS, shows a tester which allows testing in vacuum of the dynamic operation and performance of high-speed very large scale integration (VLSI) circuits, including on-chip contactless measurement of AC switching waveforms (picosecond time scales) as well as logic state evaluation (nanosecond time scales) using high energy photons (about 5–6 eV).

U.S. Pat. No. 4,051,437, Lile et al, METHOD AND APPARATUS FOR SEMICONDUCTOR PROFILING USING AN OPTICAL PROBE, Sept. 27, 1977, shows a straightforward raster sacn of a semiconductor surface, by a moving spot of light, to detect anomalies by finding changes in the surface photo voltage in the surface space charge region.

U.S. Pat. No. 4,301,409, Miller et al, SOLAR CELL ANOMALY DETECTION METHOD AND APPARATUS, Nov. 17, 1981, shows a method of detecting imperfections in solar cell material by scanning with a spot of light and monitoring for variations in voltage output.

Neither Lile et al nor Miller et all measure voltages as a function of voltage-modulated photoemission.

U.S. Pat. No. 4,266,138, Nelson Jr., et al, DIAMOND TARGETS FOR PRODUCING HIGH INTENSITY SOFT X-RAYS AND A METHOD OF EXPOSING X-RAY RESISTS, May 5, 1981, shows a technique for exposing x-ray sensitive resists to carbon K x-rays using a type 2B diamond target which dissipates considerably more power and produces higher intensity x-rays than graphite targets. Nelson uses soft x-rays from the diamond target to pattern a semiconductor mask. This is a production technique, not a testing technique.

U.S. Pat. No. 4,417,948, Mayne-Banton et al, SELF-DEVELOPING PHOTOETCHING OF POLYESTERS BY FAR UV RADIATION, Nov. 29, 1983, describes a technique for photoetching polyesters by application of ultraviolet radiation in the presence of oxygen. This is also a production technique, not a testing technique.

U.S. Pat. No. 4,380,864, P. K. Das, METHOD FOR PROVIDING IN-SITU NON-DESTRUCTIVE MONITORING OF SEMICONDUCTORS DURING LASER ANNEALING PROCESS, Apr. 26, 1983, describes a technique for positioning a surface acoustic wave device adjacent to a semiconductor being annealed, affixing an electrical contact to the top surface of the semiconductor, and using a composite of the transverse surface acoustic wave and the charge carriers of the semiconductor to produce a transverse acoustoelectric voltage which thus is a function of the semiconductor conductivity. This is a contact techique, not a contactless technique, and measures semiconductor conductivity at a known location, not voltage at a known location at a known time.

U.S. Pat. No. 4,332,833, Aspnes et al, METHOD FOR OPTICAL MONITORING IN MATERIALS FABRICATION, June 1, 1982, Aspnes et al shows a technique for utilizing the sensitivity of the dielectric function of a crystal, to crystalline-amorphous-void volume fractions, and recognizing that the volume fraction vary as a function of the measured dielectric function over an appropriate range of frequencies. This range of frequencies corresponds to photon energies of approximately 1.5 electron volts to 6 electron volts. This allows a dynamic monitoring of deposition within a reactor. This is a contactless optical technique for monitoring material deposition during thin film processing; it is not a current-voltage tester.

U.S. Pat. No. 4,408,883, Iwamoto et al, APPARATUS FOR INSPECTING AVERAGE SIZE OF FUNDAMENTAL PATTERNS, Oct. 11, 1983, shows an apparatus for determining the average size of fundamental patterns by comparing Fourier transforms of pattern images in a processor, and providing actual pattern sizes. Iwamoto et al applies coherent light focussed on a target for test, and monitors the reflected images by converting them to Fourier transforms and comparing the Fourier transforms against known image patterns. This is a contactless optical technique for image recognition; it is not a current-voltage tester.

EP-A-O No. 129 508 Battelle Memorial Institute, Louis F. Pau, PROCEDE D'EXAMEN ET DE TEST D'UN DISPOSITIF ELECTRIQUE DU TYPE DES CIRCUITS INTEGRES OU IMPRIMES, Published Dec. 27, 1984, shows a technique for chip testing for foreign particles of discontinuities by irradiating a printed circuit while applying a known strobe source to the chip, and comparing the result to a standard.

G. W. Rubloff, CONTACTLESS MEASUREMENT OF VOLTAGE LEVELS USING PHOTOEMISSION, IBM Technical Bulletin, Vol. 25, No. 3A, Aug. 1982, pp. 1171–1172, shows ultraviolet light stimulation of photoemission for contactless measurement of voltage levels, but not in the context of dynamic testing, and not with a laser (c.w., or pulsed). The author is a coinventor.

Henley, LOGIC FAILURE ANALYSIS OF VLSI CMOS USING A LASER PROBE, Spectrum Sciences, 3050 Oakmead Village Drive, Santa Clara, Calif., 95051, shows a laser contactless probe for an integrated circuit, using available pin connections to conduct stimulated current-voltage signals to a computer for analysis. Henley does not use an adjacent detector, but must dedicate a certain amount of circuitry (external to the integrated circuit under test) to the conduction of test signals. No photoemission from the circuit is created. The logic state of the integrated circuit is determined by interrupting its dynamic operation and then measuring the current transient induced in the power supply by laser light absorption in an active semiconductor region (the light does not impinge on the metal wires and nodes of the circuit); as a result, neither logic states nor AC switching waveforms are determined during dynamic operation of the circuit.

Kudo, Nihei and Kamada, COMPUTER CONTROLLED ESCA FOR NONDESTRUCTUVE SURFACE CHARACTERIZATION UTILIZING A TV-TYPE POSITION SENSITIVE DETECTOR, Rev. Scientific Instruments, Vol. 49, No. 6, June 1978, pages 756–759, American Institute of Physics, New York, US. Kudo et al uses an X-ray tube to excite the sample with soft X-ray photons. The intent is to excite spectroscopic light emissions for surface chemical states analysis, Kudo et al concerns itself with a different problem (spectroscopy rather than nonintrusive noncontact dynamic testing); uses different excitation (soft X-rays instead of pulsed laser); and different output processing (videocon rather than electron detector).

Ito, Goto and Furukawa, HEMISPHERICAL RETARDING TYPE ENERGY ANALYZER FOR LSI TESTING BY AN ELECTRON BEAM, Fujitsu-Scientific & Technical Journal, Vol. 19, No. 4. Dec. 1983, pp. 431–441, Kawasaki, Japan. Ito et al shows a retarding type energy analyzer to measure the internal voltage of a large scale intergrated circuit with an electron beam. Acknowledging that the hemispherical retarding type energy analyzer is convention, Ito et al provides an improved extraction system with a buffer grid between a control grid between a control grid and an extraction grid.

Jowett, SURFACE ANALYTICAL TECHNIQUES APPLIED TO ELECTRONIC COMPONENTS, Microelectronics Journal, Vol. 11, No. 2, March/April 1980, pp. 35–40, Mackintosh Publication Ltd., Luton, UK. Jowett surveys surface analytical techniques including various e-beam, X-ray, ion and laser excitation and measurement of the results. Jowett identifies laser scanning as useful "to map DC and high frequency gain . . . , to reveal areas . . . operating in a nonlinear manner, to map temperature . . . , to determine [and to change] internal logic state . . . , observing the circuit electrical operations and the metallisation pattern through the back of the chip."

Jowett provides a two-laser technique for ". . . observing the circuit electrical operation . . . "

Jowett states that "The effect of directing on a semiconductor light of energy greater than that of the band gap is to create electron hole pairs within the material. These can be collected as photocurrent. If the light is focussed to a spot and moved over exposed portions of a device, it is possible to learn a great deal about the internal operation of the device by interpreting the photoresponse. The interpretation is faciliated if the photoresponse is presented on the screen of a cathode ray tube whose electron beam is deflected in synchronizm with the moving light spot since a two-dimensional display of the photoresponse of the device is then presented."

Jowett collects electrical signals directly from the test chip, not via photoemission. This is an optical matching technique, not a technique for noncontact dynamic testing to determine instantaneous voltage levels in a test chip during exercise.

DATA PROBE MODEL 2010 IC LOGIC LASER ANALYSER, Mitsui & Co., 1984. This paper shows a mouse driven laser beam probe using the "solar-cell" effect.

Menzel and Kubalek, SECONDARY ELECTRON DETECTION SYSTEMS FOR QUANTITATIVE VOLTAGE MEASUREMENTS, Scanning, Vol. 5.4, 151–171 (1983). Menzel et al shows e-beam probed voltage measurements using retarding field analyzers for secondary electrons.

U.S. Pat. No. 4,417,203, Pfeiffer et al, SYSTEM FOR CONTACTLESS ELECTRICAL PROPERTY TESTING OF MULTI-LAYER CERAMICS, Nov. 22, 1983, describes an electron beam system for noncontact testing of conductors embedded in dielectric material. The entire surface is charged by a wide-focus e-beam, and a single conductor, available at the surface, is activated by a sharp focus e-beam probe at its surface pad. The resulting difference in secondary emission is used to find opens and shorts.

U.S. Pat. No. 4,415,851, Langner et al, SYSTEM FOR CONTACTLESS TESTING OF MULTILAYER CERAMICS, Nov. 15, 1983, describes an e-beam tester in which a wide-focus e-beam at the back of a chip coacts with a sharp-focus e-beam probe at the front, to find back-to-front conductive paths by enhanced secondary emission.

U.S. Pat. No. 4,419,530, Nath, SOLAR CELL AND METHODS FOR PRODUCING SAME, Dec. 6, 1983, describes a technique for electrically isolating areas of a large semiconductor solar cell for fault bypass.

U.S. Pat. No. 4,296,372, Feuerbaum, TECHNIQUES FOR IMPRESSING A VOLTAGE WITH AN ELECTRON BEAM, Oct. 20, 1981, describes a technique of continuity testing a conductor in a passivated semiconductor chip, using a metal film over the passivating layer, and an e-beam probe to connect the metal film to a passivated conductor via a diffusion cloud. The result is a conductive path from metallic overlayer to buried conductor, permitting probing through the insulating layer via the e-beam.

R. B. Bush et al, PHOTOCONDUCTOR CONTACTING FOR MODULE TESTING, IBM Technical Disclosure Bulletin, Vol. 15, No. 6, Nov. 1972, pp. 2032–2033, shows a conductive-liquid probe with photoconductive scanning. It is not relevant.

Electron beam testing methods, also known, require surface availability of metal conductor points and are therefore inadequate for testing of passivated circuits. Furthermore, the electrom beam causes damage to passivating layer materials such as oxides and mus therefore be carefully directed away from such areas even in current electron-beam testing of metal points available at the surface.

The prior art does not teach nor suggest the invention, which permits room-environment non-contact testing even though the integrated circuit be passivated by an insulation layer, does not require high energy beams, and does not require contacts open to the surface.

SUMMARY OF THE INVENTION

The object of the invention is to provide sensitive room-environment real-time laser testing of integrated circuits with test access pads buried underneath a passivation layer, by the user of a transparent conductive metallic overlayer on the chip-to-test.

Another object of the invention is to extend laser testing of integrated circuits to carry out room-environment real-time testing of AC switching waveforms and logic states, with oxide, insulator, or passivation layers present on top of the metal test points, thus bringing the method closer to addressing the condition of the chip after manufacturing and making possible the testing in air rather than in a vacuum.

A feature of the invention is the use of a thin metallic overlayer over the passivation layer of a chip-to-test, the metallic layer being thin enough to transmit the laser selection beam but yet conductive enough to serve as a collector for photoemitted electrons.

Another feature of the invention is the biasing of the metallic over-layer to provide increased discrimination.

Still another feature of the invention is the relative ease of removal of the metallic overlayer.

An advantage of the invention is that the combination of thin insulation layer and metallic collector overlayer provides a photoemission transfer path for relatively low energy photons, and thus require relatively low energy laser selection beams available from conventional lasers.

Another advantage of the invention is that it achieves high time resolution (5 picosecond or less) and lateral resolution (1 micron or less) and high voltage resolution (of order 1mV in reasonable measurement times).

The manufacturing advantage of truly nondestructive testing in air, with passivation layers present, which allows testing in the same tool used to carry out personalization, significantly extends the economic advantages of in-process testing by providing freer choice of test time and easier test setup.

The foregoing and other objects, features and advantages of the invention will be apparent from the more particular description of the preferred embodiments of the invention, as illustrated in the accompanying drawings.

DESCRIPTION OF A PREFERRED EMBODIMENT OF THE INVENTION

Figure 1:
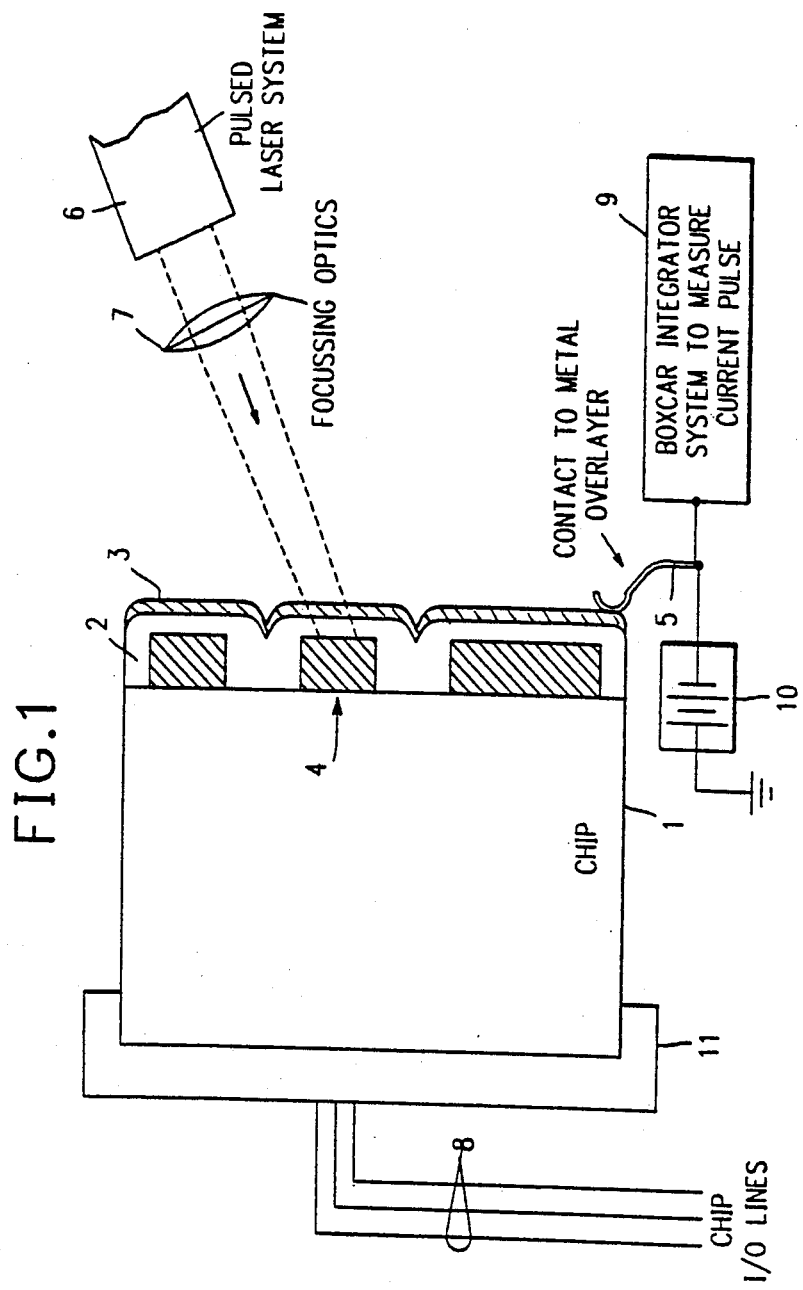
FIG. 1 is a schematic diagram of the invention.

FIG. 1 is a schematic diagram of the invention, showing chip-to-test 1, insulating layer 2, conductive overlayer 3, representative test point 4, output contact 5, laser 6, focussing optics 7, representative circuit exercise input lines 8 and detector logic 9, which is a boxcar integrator system to measure the current pulse. The conductive overlayer 3 may be biased by optional bias generator 10 to control the threshold for photon assisted tunneling. The chip-to-test 1 is mechanically and electrically mounted in holder 11. Insulating layer 2 is the passivation; conducting layer 3 is the metal overlayer which serves as collector for the detector logic 9.

Figure 2:
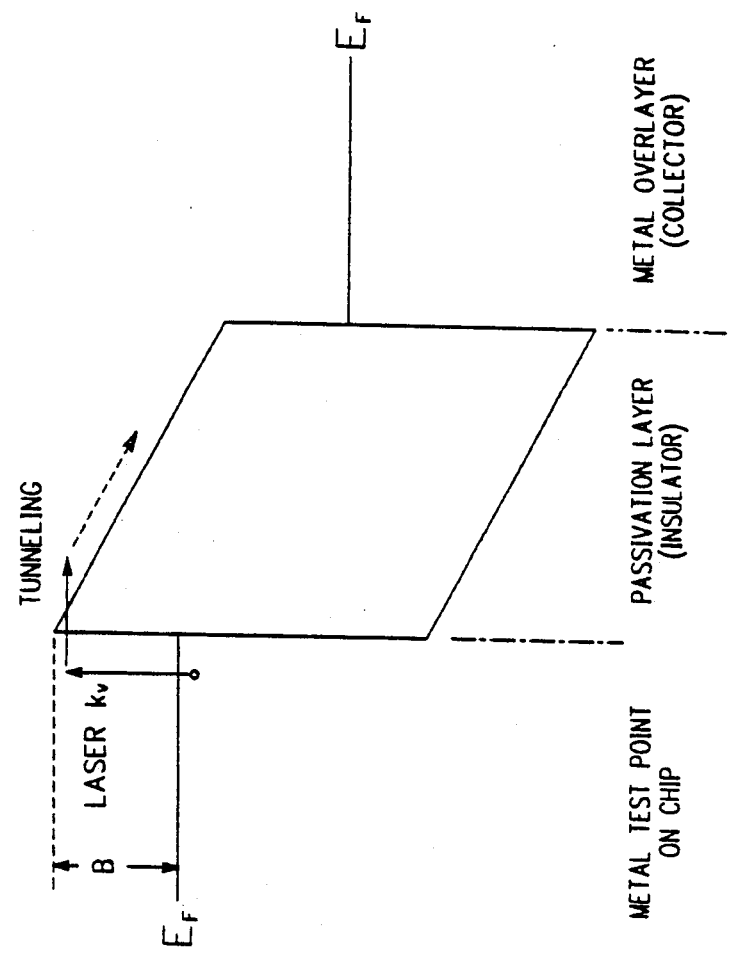
FIG. 2 is an energy level diagram illustrating tunneling from the metal test point on the chip through the passivation layer to conductive overlayer.

FIG. 2 is an energy level diagram showing laser-induced excitation of electrons in the metal test point followed by tunneling through the insulation (passivation) layer 2 (FIG. 1) to the conducting layer 3 (FIG. 1) which serves as collector.

An integrated circuit is accessed for testing by focussing a pulsed laser beam onto an included metal test point buried underneath a thin film insulating layer and metallic overlayer, causing photoemission out of the metal test pad, through the insulator to the metallic overlayer as collector. The metal overlayer (collector) is effectively transparent parent to the laser light because it is thin (a few hundred Angstroms or less) or optially transparent. The laser beam passes through the metallic overlayer and the passivation layer readily; the result is photoemission caused by relatively low energy laser photons (about 2.5–3.0 eV). Even lower energies are employed than the barrier energy B (FIG. 2) since the laser photon energy should be slightly less than the threshold for electron emission from the metal test point into the insulator conduction band. In this way, with an electric field applied across the insulator, photon-assisted tunneling occurs through the top of the barrier at the metal test point interface with the insulator.

A pulsed laser beam (about 5 picoseconds pulse width or less) is focussed onto a metal test point (about 1 micron diameter or less), but in this case the test point is burried underneath a thin film insulating layer (e.g., silicon dioxide) of order 0.1–1.0 microns thick. The presence of the insulator or passivation layer causes two fundamental changes in the situation.

First, the threshold energy for photoelectron emission from the metal test pad into the insulator is notably lowered by the insulating layer. Weinberg and Hartstein show that the threshold for injecting electrons from the metal into the insulator conduction band is only 3.15 eV for the aluminum/silicon dioxide interface, compared to about 4.2 eV from air-exposed A1 into vacuum. This threshold-lowering makes it possible to use laser photons with lower energy, i.e., in the range around 2.5–3.0 eV. Since most insulators used in devices as oxides or passivation layers are transparent in this range, the laser light passes through the passivation layer readily. Such lower energy laser photons are much easire to generate using conventional laser sources than are higher energy photons. Even lower energies are employed since the laser photon energy should be slightly less than the threshold for direct electron emission from the metal test point over the barrier (B in FIG. 2) and into the insulator conduction band. The tunneling through the barrier is enabled by the electric field present across the insulator due to the voltage bias aplied to the metallic overlayer as referenced to the voltage of the metal test point).

Second, a different method must be used to discriminate the voltage of the metal test point. This method is shown schematically in FIG. 1. After fabrication of the chip 1 is complete and the passivation layer 2 has been added, a thin metallic overlayer 3 (collector) consisting of a thin conductive metal or a conducting transparent layer like tin oxide is deposited on top of the passivation layer 2. The conducting overlayer 3 is sufficiently thin or otherwise transparent that the incident laser beam can still penetrate to the metal test pad 4. For an absorbing metal collector, the thickness should be of order 100 Angstroms. By contacting the collector electrically, with contact 5, conducting overlayer 3 can be biased and used to measure the current it collects. The testing procedure then consists of measuring the current pulse collected as a result of the picosecond laser pulse applied to a specific metal test point on the chip at a specific time. The conducting overlayer 3, thin metal on top of the passivation layer 2, can then be removed if needed.

To achieve voltage sensitivity, the small changes in voltage of the metal test point must result in significant changes in the amount of current measured at the collector. Once electrons have been excited into the insulator conduction band, they can travel substantialy distances (well over 1000 Angstroms even for a poor quality oxide) in the presence of an accelerating field. In this disclosure the voltage sensitivity needed is obtained by photon-assisted tunneling as depicted in FIG. 2. The laser photon energy is chosen to be somewhat below the threshold for direct photoemission from the metal test pad into the insulator conduction band (B in FIG. 2). The laser photon excites electrons to an energy just below that of the top of the interface barrier (at the metal test point/insulator interface), and these excited electrons can then tunnel through the barrier. Since the tunneling probability depends exponentially on the field in the insulator and the collector bias is fixed, the tunneling current measured at the collector is very sensitive to the voltage of the metal test pad (emitter). The largest signals are obtained by choosing the laser photon energy very close to the energy threshold B, while highest voltage sensitivituy is achieved by reducing the tunneling current somewhat and operating somewhat further below threshold (e.g., by 0.5 eV). For the aluminum/silicon dioxide interface, conventional argon and krypton lasers, which are readily focussed to near diffraction limits (one micron spot size or less) and mode-locked to achieve picosecond pulse widths, provide the right range of photon energies for this method.

The testing technique is directed at real-time contactless testing of internal nodes on the chip when passivation layers are already present. Passivation or insulating layers are required. The testing need not be carried out in vacuum, a very significant advantage. For purposes of discussion, the chip-to-test may be a full wafer, an area on a wafer, a full chip, an area on a chip, or other related item, and may be called simply a "chip".

Three specific applications are as follows:

First, testing of fully manufactured product can be carried out after the chip has been completed, in which case a blanket metallic conductive overlayer 3 is deposited, the testing done, and if desired the overlayer removed (by ion sputtering or chemical etching, for example).

Figure 3:
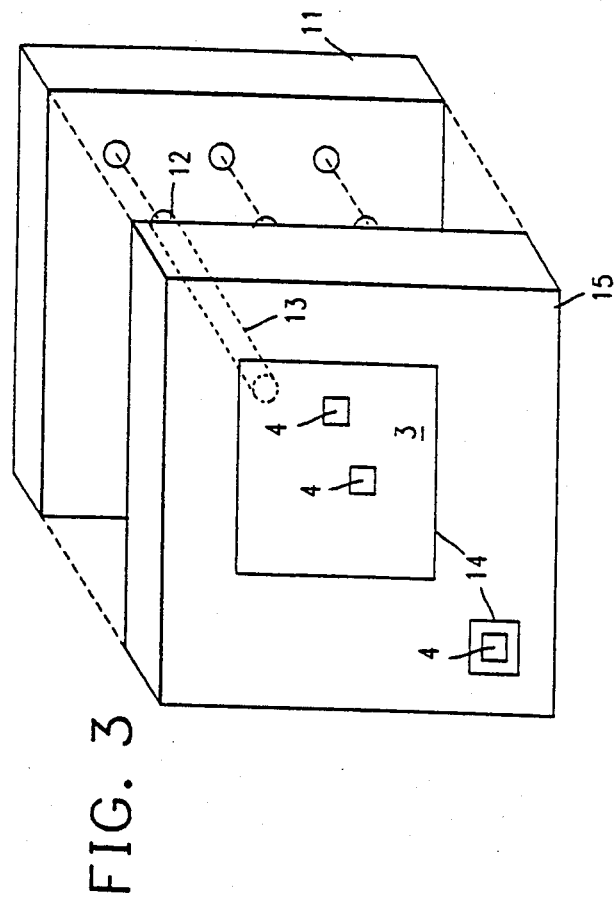
FIG. 3 is a simplified diagram of a chip with features enhancing testability.

Second, the product chip may be manufactured with the blanket metal conductive overlayer 3 on top of the passivation layer 2, and one I/O pin (12—FIG. 3) in the chip package may be reserved as a contact, connected by via connection 13 to the conductive overlayer. The testing of representative test sites 4 can be carried out on the packaged chip, in an in-line socket mount with optical windows 14 included in the package to permit entry of the laser light. Light other than at windows 14 may be blocked by opaque passivation or intervening layers 15, shown diagrammatically in FIG. 3.

Third, at some critical stages of the manufacturing process or during advanced development, oxide or passivation layers and metal testing overlayers may be added to carry out real-time testing; if the chip qualifies, these layers may then be removed and further processing done.

In cases where in-air testing is desirable but there is no permanent passivation layer in place, a thin (few hundred Angstroms thick) temporary passivation layer, of insulating material such as a silicon oxide or plastic such as polyimide, may be temporarily deposited prior to deposition of the thin conductive overlayer.

Thus, while the invention has been described with reference to preferred embodiments with three specific applications and other variations, it will be understood by those skilled in the art that the foregoing and other changes in form and details may be made without departing from the scope of the invention.

What is claimed is:

1. An integrated circuit process intermediate chip-to-test having enhanced susceptibility to non-contact dynamic photon assisted tunneling testing, having a multiplicity of operational circuits of which a testable plurality of such circuits are arrayed on a surface under a passivation layer comprising:

a plurality of conductive test sites associated with such circuits, at identifiable locations accessible by photons, and a transparent conductive overlayer disposed on said passivation layer, said overlayer comprising test output connecting means, whereby when such chip-to-test is mounted for exercise in a test operational mode to generate operational parameters at the test sites, the test sites are photon accessed during exerices, and photon assisted tunneling values related to the operational parameters are measured from said transparent conductive overlayer.

2. An integrated circuit process intermediate chip-to-test having enhanced susceptibility to non-contact dynamic photon assisted tunneling testing, having a multiplicity of operational circuits of which a testable plurality of such circuits are arrayed on a surface under a passivation layer comprising:

a plurality of conductive test sites associated with such circuits, at identifiable locations accessible by photons;

a transparent conductive overlayer disposed on said passivation layer, said overlayer comprising test output connecting means, when such chip-to-test is mounted for exercise in a test operational mode to generate operational parameters at the test sites, the test sites are photon accessed during exercise, and photon assisted tunneling values related to the operational parameters are measured from said transparent conductive overlayer;

at least one input-output contact designated for test connection; and connection means connecting said contact to said transparent conductive overlayer.

3. A testing method for an integrated circuit chip-to-test comprising the steps of:

(a) providing a chip-to-test covered with a passivation layer with a plurality of test sites at identifiable locations accessible by photons, the passification layer being selected of material which is photon, transmissive and susceptible to photon assisted tunneling and dimensioned for photon assisted tunneling;

(b) adding a thin conductive overlayer over the passivation layer, said overlayer being metallic or otherwise electrically conductive while being penetrable by photons;

(c) coupling chip-to-test exercise means to the chip-to-test to cause electrical activity in the chip-to-test thereby generating voltages at the test sites which differ for proper and faulty operation of the chip-to-test;

(d) coupling laser means for transmitting photons to a selected test site on the chip-to-test to excite photoemission at the test site commensurate with the voltage at the test site, and (e) coupling current measurement means to said overlayer to measure the photon assisted tunneling electron current which is a composite function of the photon excited photoemission at the test site and voltage at the test site, whereby the selected test site provides to said current measurement means different measures for proper operation and faulty operation of the chip-to-test so that contactless testing of the chip-to-test is achieved.

4. A testing method for an integrated circuit chip-to-test comprising the steps of:

(a) providing a chip-to-test covered with a passivation layer with a plurality of test sites at identifiable locations accessible by photons, the passivation layer being selected of material which is photon transmissive and susceptible to photon assisted tunneling and dimensioned for photon assisted tunneling;

(b) adding a thin conductive overlayer over the passivation layer, said overlayer being metallic or otherwise electrically conductive while being penetrable by photons;

(c) coupling bias means to said overlayer for controlling the photon assisted tunneling;

(d) coupling chip-to-test exercise means to the chip-to-rest to cause electrical activity in the chip-to-test thereby generating voltages at the test sites which differ for proper and faulty operation of the chip-to-test;

(e) coupling laser means for transmitting photons to a selected test site on the chip-to-test to excite photoemission at the test site commensurate with the voltage at the test site, and (f) coupling current measurement means to said overlayer to measure photon assisted tunneling electron current which is a composite function of the photon excited photoemission at the test site and the voltage at the test site, whereby the selected test site provides to said current measurement means different measures for proper operation and faulty operation fo the chip-to-test so that contactless testing of the chip-to-test is achieved.

5. A testing method for an integrated circuit chip-to-test comprising the steps of:

(a) providing a chip-to-test covered with a passivation layer with a plurality of test sites at identifiable locations accessible by photons, the passivation layer being selected of material which is photon transmissive and susceptible to photon assisted tunneling and dimensioned for photon assisted tunneling;

(b) adding a thin conductive overlayer over the passivation layer, said overlayer being metallic or otherwise electrically conductive while being penetrable by photons;

(c) coupling chip-to-test exercise means to the chip-to-test to cause electrical activity in the chip-to-test thereby generating voltages at the test sites which differ for proper and faulty operation of the chip-to-test;

(d) coupling laser means for transmitting photons to a selected test site on the chip-to-test to excite photoemission at the test site commensurate with the voltage at the test site;

(e) coupling current measurement means to said overlayer to measure photon assisted tunneling electron current which is a composite function of the photon excited photoemission at the test site and the voltage at the test site, whereby the selected test site provides to said current measurement means different measures for proper operation and faulty operation of the chip-to-test, and (f) removing said overlayer after testing is completed.

* * * * *